Jan. 7, 1964 F. W. DEHMELT 3,117,040
TRANSISTOR
Filed Dec. 28, 1959
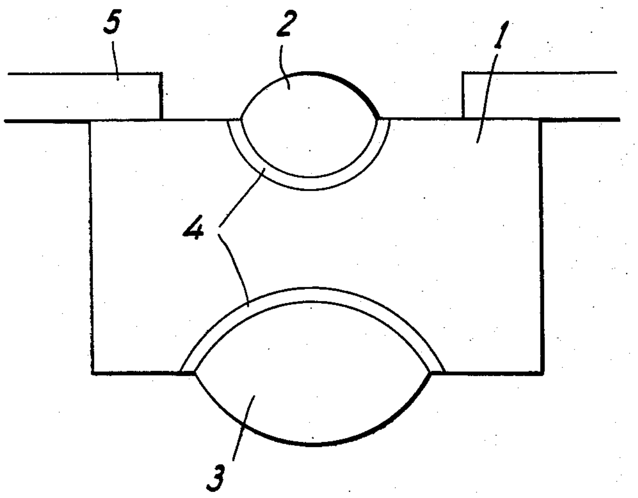
Inventor:
FRIEDRICH WILHELM DEHMELT
By: George H. Spencer
ATTORNEY

United States Patent Office 3,117,040
Patented Jan. 7, 1964

3,117,040
TRANSISTOR

Friedrich W. Dehmelt, Ulm (Danube), Germany, assignor to Telefunken Aktiengesellschaft Filed Dec. 28, 1959, Ser. No. 862,254
Claims priority, application Germany Jan. 3, 1959
1 Claim. (Cl. 148—33.4)

The invention relates to a transistor and to a method of producing it.

The germanium transistors presently in commercial use fail to operate properly at temperatures above 80° to 100° centigrade. This is due to the fact that the thermally produced electron-hole pairs increase the density of minority carriers in the emitter zone, in the base zone and in the collector zone to such a degree that at the emitter the efficiency of carrier injection reduces and the collector reverse current increases to values higher than the control current itself.

It is an object of the invention to provide a transistor which operates properly at temperatures higher than the present-day limit of 80° to 100° centigrade.

According to the teaching of the present invention the gap between the full band and the conduction band in the emitter and collector zones is made greater than the corresponding gap in the base zone. Or, in other words, the forbidden band in the emitter and in the collector zones is made broader than the forbidden band in the base zone. The transmitter thus produced has the same type of single-crystal lattice structure in the collector zone, in the emitter zone, and in the base zone, but the band gaps in these zones differ.

Still further objects and the entire scope of applicability of the present invention will become apparent from the detailed description given hereinafter; it should be understood, however, that the detailed description and specific examples, while indicating preferred embodiments of the invention, are given by way of illustration only, since various changes and modifications within the spirit and scope of the invention will become apparent to those skilled in the art from this detailed description.

The drawing illustrates a transistor having the feature mentioned above. Basically, it is a n-conductive, single crystal, germanium disk or wafer 1 having a thickness of above 50$\mu$ and having a conductivity of above 0.1$\Omega$/cm. 2 is an emitter wafer and 3 is a collector wafer. These wafers consist of an eutectic gold-silicon mixture including about 2 atom percent gallium. The mixture need not have exactly an eutectic consistency at the alloying temperature of about 550 degrees at which these wafers are alloyed to the disk 1. The gold:silicon ratio atomic amounted to approximately 2:1. The alloying temperature is a few degrees above the melting point of the eutectic gold-silicon mixture. For the gold-silicon ratio given above this melting temperature is about 550° C. The selection of this alloying temperature produces flat and even barrier layers in the transistor body. After thermodynamic equilibrium has been reached between the eutectic solution and the germanium to be solved, the entire system is cooled very slowly at approximately 50 degrees per hour. During cooling recrystallization zones 4 are produced at the inner surfaces of the wafers adjacent the germanium body. Silicon has a demixing coefficient with respect to germanium of larger than unity; thus a mixed crystal is produced having a silicon concentration of about 50%. Simultaneously, i.e. still during cooling, gallium atoms are embedded in this recrystallizing silicon-germanium mixed crystal as an impurity producing p type conductivity therein. Finally, a ring-shaped base electrode is bonded to the disk 1 adjacent the emitter in such a manner as to avoid producing a barrier layer, in a manner known per se. Upon securing appropriate conductors to the emitter and collector wafers the transistor is operable.

It has been found that a transistor thus produced has a gap between full band and conductive band of .7 to .75 volt in the base zone, while the corresponding gap in the emitter and collector zones 4 is 0.9 to 1 volt. In other words, the forbidden band is larger in the collector and the emitter zones than in the base zone. In case the temperature of a transistor, made according to this disclosure, increases above the present-day limit during operation, the thermally produced concentration of electron and hole pairs does increase only very little above its value at room temperature. In the collector and emitter zones, however, having a forbidden band width of about 0.9 to 1 volt, the concentration of thermally produced electron-hole pairs has been increased simultaneously by an amount which is higher than the increase in the base zone. However, the initial concentrations in collector and emitter zones are more than a thousand times smaller than the thermally produced electron-hole pair concentration at room temperature in the base zone. It is noted that in the collector and emitter zones, the electron-hole pair concentration equals the minority carrier concentration therein. Therefore, the entire system can be heated during operation to a temperature well above the present-day limit and still remain operable, because the minority charge carrier concentration still remains sufficiently small in the collector and emitter zones to let the transistor operate effectively. Furthermore, such device has the advantage that the electrons migrate under acceleration from the emitter zone to the base zone due to the gap between the lower edge of the conduction band in the emitter zone (large width of forbidden band) and the corresponding edge in the base zone (small width of forbidden band at a given Fermi level gap). Due to the small concentration of minority charge carriers in the emitter zone the injector efficiency is extraordinarily high. Thus, this arrangement is suitable for power transistors of high and constant current amplification.

In particular, upon an increase of the operation temperature up to 120° centigrade, the thermally produced electron-hole pair concentration increases in the base zone from $2.10^{10}$ at room temperature up to about $2.5 \times 10^{13}$. Indeed, the thermally produced electron-hole pair density in the emitter and collector zones is also increased from $5.10^{6}$ at room temperature to 1500 times this value. Even though the increase itself is larger in the collector and emitter zones than in the base zone, one has to consider that in the collector and emitter zones the initial concentration of minority charge carriers at room temperature is about $5.10^{6}$ which is 3000 times smaller than the corresponding concentration in the base zone at room temperature. This means that upon heating the system up to 120° centigrade at a width of the forbidden band in the emitter and collector zones of about one volt, the minority charge carrier concentration in the emitter and collector zones is still so small that such transistor can still effectively operate at 120° centigrade. Due to the high ohmic contact of the collector, the rectifying layer "breathes"

into the collector area upon application of the collector biasing voltage, whereby voltages up to 50 volts are permissible.

I claim:

A germanium-silicon transistor comprising an n-type base zone substantially comprising germanium and having a forbidden band width of .7 to .75 volt; and p-type emitter and collector zones comprising substantially mixture-crystal structure of silicon and germanium having a forbidden band width of .9 to 1 volt, said transistor being produced by alloying two approximately eutectic gold-silicon wafers in spaced relationship on a single crystal germanium body at a temperature below the melting point of the body, said wafers including a doping substance.

References Cited in the file of this patent

UNITED STATES PATENTS

| | | |
|---|---|---|
| 2,855,334 | Lehovec | Oct. 7, 1958 |
| 2,877,147 | Thurmond | Mar. 10, 1959 |
| 2,919,389 | Heywang | Dec. 29, 1959 |
| 2,961,475 | Sommers | Nov. 22, 1960 |

OTHER REFERENCES

Handbook of Semiconductor Electronics by Hunter, McGraw-Hill Book Co., 1st edition, 1956 (pp. 3–13 relied upon).